United States Patent
Pollock et al.

(10) Patent No.: US 7,164,995 B2
(45) Date of Patent: *Jan. 16, 2007

(54) DIFFERENTIAL TERMINATION AND ATTENUATOR NETWORK FOR A MEASUREMENT PROBE

(75) Inventors: Ira G. Pollock, Hillsboro, OR (US); Richard A. Van Epps, Vancouver, WA (US)

(73) Assignee: Tektronix, Inc., Beaverton, OR (US)

( * ) Notice: Subject to any disclaimer, the term of this patent is extended or adjusted under 35 U.S.C. 154(b) by 72 days.

This patent is subject to a terminal disclaimer.

(21) Appl. No.: 11/051,596

(22) Filed: Feb. 4, 2005

(65) Prior Publication Data

US 2006/0178846 A1    Aug. 10, 2006

(51) Int. Cl.
| | |
|---|---|
| G01R 15/00 | (2006.01) |
| G01R 27/28 | (2006.01) |
| G01R 1/20 | (2006.01) |
| G06F 19/00 | (2006.01) |
| H03L 5/00 | (2006.01) |
| H01P 1/22 | (2006.01) |
| H03H 7/24 | (2006.01) |

(52) U.S. Cl. ............... 702/57; 702/64; 702/117; 324/126; 327/308; 333/81 R

(58) Field of Classification Search ......... 702/118, 702/57

See application file for complete search history.

(56) References Cited

U.S. PATENT DOCUMENTS

| | | | | |
|---|---|---|---|---|
| 4,393,347 A | * | 7/1983 | Looper | 324/126 |
| 4,833,418 A | * | 5/1989 | Quintus et al. | 330/9 |
| 6,629,048 B1 | | 9/2003 | Law et al. | |

* cited by examiner

*Primary Examiner*—John Barlow
*Assistant Examiner*—Lisa Sievers
(74) *Attorney, Agent, or Firm*—William K. Bucher

(57) ABSTRACT

A differential termination and attenuator network receives a differential input signal having a DC common mode voltage. The network circuit includes input termination resistors coupled in parallel with corresponding resistive attenuator circuits. A monitoring circuit coupled to input nodes of the network generates an output signal representative of the combination of a DC common mode voltage on the input nodes and an applied termination voltage. A control circuit receives the output signal from the monitoring circuit and the applied termination voltage and generates a scaled termination voltage and a scaled compensation voltage and drive currents. The scaled termination and compensation voltages and drive currents provide DC currents through the input termination resistances and the attenuators for nulling DC currents at the network input nodes and provides a DC common mode voltage output from the attenuators for optimizing the dynamic range of a differential measurement amplifier.

10 Claims, 5 Drawing Sheets

DIFFERENTIAL TERMINATION AND ATTENUATOR NETWORK FOR A MEASUREMENT PROBE

BACKGROUND OF THE INVENTION

The present invention relates generally to differential measurement probes with input signal terminations and more particularly to a differential termination and attenuator network for a measurement probe having DC common mode voltage compensation.

High speed measurement systems generally feature a resistive input termination that matches the characteristic impedance of the input signal transmission line. This is done to minimize input signal reflection problems and provide the best signal fidelity. A dual 50 ohm input termination network is the most common topology for high speed differential systems. Although 50 ohm input terminations are usually connected to the measurement system ground, some applications require termination to a common mode DC termination voltage. The availability of an adjustable DC termination voltage in the measurement termination network allows control of the DC loading of the signal source, such as in a high speed serial data signal having a significant DC common mode component.

FIG. 1 is a schematic representation of a termination network 10 having an adjustable DC termination voltage $V_{TERM}$ used in the P7350SMA Differential Probe, manufactured and sold by Tektronix, Inc. The DC termination voltage $V_{TERM}$ is provided by an external source and coupled to the common node of the termination resistors 12 and 14. The termination resistors 12 and 14 are 50 ohm resistors that typically match a 50 ohm differential source impedance of a device under test. The differential input signal is coupled via SMA input connectors 16 and 18 to the termination resistors 12 and 14 and to the inputs of high impedance attenuators 20 and 22. The opposite ends of the high impedance attenuators 20 and 22 are coupled to ground. Each attenuator 20 and 22 has a resistive voltage divider consisting of resistive elements 24 and 26 coupled in parallel with a compensating capacitive voltage divider consisting of capacitive elements 28 and 30. The intermediate nodes 32 of the resistive/capacitive voltage divider networks are coupled to the inverting and non-inverting inputs of a differential amplifier 34.

The matching of the DC termination voltage $V_{TERM}$ of the measurement probe to the DC common mode component of the input signal allows the input signal to be directly connected to the measurement probe inputs without AC coupling by minimizing the DC loading on the signal source. The high speed differential amplifier 34 generally has a limited input dynamic range. The high impedance input attenuators 20 and 22 are provided to extend the linear dynamic range of the high speed differential amplifier 34. The DC common mode voltage at the attenuators 20 and 22 outputs results from both the common mode component of the input signal and from the common mode termination voltage $V_{TERM}$ of the termination network. A well designed differential measurement amplifier 34 will have a very large common mode rejection ratio, CMRR, which largely eliminates the DC common mode voltage in the amplifier output signal. Any non-zero, DC common mode voltage present at the input of the differential amplifier 34, however, will reduce the effective linear dynamic range of the amplifier 34. A large DC common mode voltage in the input signal can easily overdrive the differential amplifier 34, making it impossible to measure the often small differential mode signal.

What is needed is an input differential termination and attenuation network for a measurement probe that provides a DC common mode voltage output to the inputs of a differential measurement amplifier for optimal dynamic range of the amplifier. The input differential termination and attenuation network should monitor the input signal and provide a scaled DC termination voltage that can be adjusted to produce zero loading of the DC component of input signal source. The input differential termination and attenuation network should also provide a scaled compensation voltage that produces the optimal dynamic range for the differential measurement amplifier.

SUMMARY OF THE INVENTION

Accordingly, the present invention is a differential termination and attenuator network receives a DC common mode voltage from a voltage source having source resistances. The differential termination and attenuator network generates a scaled termination voltage and drive current and a scaled compensation voltage and drive current to null DC currents at differential input nodes of the network and generate a DC common mode voltage at the output of the network that provides optimum dynamic range for a differential measurement amplifier. The differential termination and attenuator network has first and second input termination resistances having a common node and respective network input nodes receiving the DC common mode voltage from the voltage source. The network input nodes are also coupled to respective input nodes of first and second attenuators having a common node. A monitoring circuit is coupled to the network input nodes for generating an output signal representative of the combination of a DC common mode voltage on the input source resistances of an input voltage source and a voltage representative of an applied termination voltage on the input termination resistances. The monitoring circuit is preferably a resistive voltage divider network having high impedance inputs relative to the first and second input termination resistances. A control circuit receives the applied termination voltage and the monitoring circuit output signal and generates a scaled termination voltage and drive current and a scaled compensation voltage and drive current that are a function of the applied termination voltage and the DC common mode voltage. The scaled termination voltage and drive current are coupled to the common node of the first and second input termination resistances and the scaled compensation voltage and drive current are coupled to the common node of the first and second attenuators. The scaled termination voltage and drive current and the scaled compensation voltage and drive current provide DC currents through the input termination resistances and the attenuators for nulling DC currents at the network input nodes and provide a DC common mode voltage output from the first and second attenuators for optimizing the dynamic range of a differential measurement amplifier.

Each input termination resistance is implemented as an input termination resistor coupled in parallel with one of the respective first and second attenuators. The attenuators are implemented with first and second resistors with one side of the first resistor coupled to one of the first and second input termination resistors and the other side coupled to one side of the second resistor at the output node of the attenuator and the other side of the second resistor coupled to receive the scaled compensation voltage and drive current at the common node of the first and second attenuators.

The scaled termination and scaled compensation voltages have scaling factors that are a function of the first and second input termination resistors and the first and second resistors of the respective first and second attenuators. The scaled termination voltage has a first scaling factor providing a first voltage proportional to the applied termination voltage and a second scaling factor providing a correction voltage proportional to the difference between the DC common mode voltage on the input network nodes of the first and second input termination resistances and the applied termination voltage. The scaled compensation voltage has a first scaling factor providing a first voltage proportional to the applied termination voltage and a second scaling factor providing a correction voltage proportional to the difference between the DC common mode voltage on the input network nodes of the first and second input termination resistances and the applied termination voltage. In the preferred embodiment of the invention, the scaled termination voltage and drive current and the scaled compensation voltage and drive current produce a substantially zero volts DC common mode voltage from the first and second attenuators.

The control circuit has a correction differential amplifier receiving as inputs the output signal from the monitoring circuit and the applied termination voltage. The correction differential amplifier generates an output signal representative of the difference between the output signal from the monitoring circuit and the applied termination voltage. A first summing node is coupled to receive the applied termination voltage and the output signal from the correction differential amplifier and generates an output signal representative of the applied termination voltage and an attenuated representation of the output signal from the correction differential amplifier. The output signal from the first summing node is coupled to a first drive amplifier having a scaling gain factor for generating the scaled termination voltage. A second summing node is coupled to receive the applied termination voltage and the output signal from the correction differential amplifier and generates an output signal representative of the applied termination voltage and the output signal from the correction differential amplifier. The output signal from the second summing node is coupled to a second drive amplifier having a scaling gain factor for generating the scaled compensation voltage.

In the preferred embodiment of the invention the first summing node has an attenuation circuit receiving the output signal from the correction differential amplifier and a summing amplifier. The summing amplifier has an input node coupled to receive the applied termination voltage and an attenuated representation of the output signal from the correction differential amplifier. The summing amplifier generates the output signal representative of the applied termination voltage and attenuated representation of the output signal from the correction differential amplifier.

The objects, advantages and novel features of the present invention are apparent from the following detailed description when read in conjunction with appended claims and attached drawings.

DETAILED DESCRIPTION OF THE PREFERRED EMBODIMENT

Figure 1:
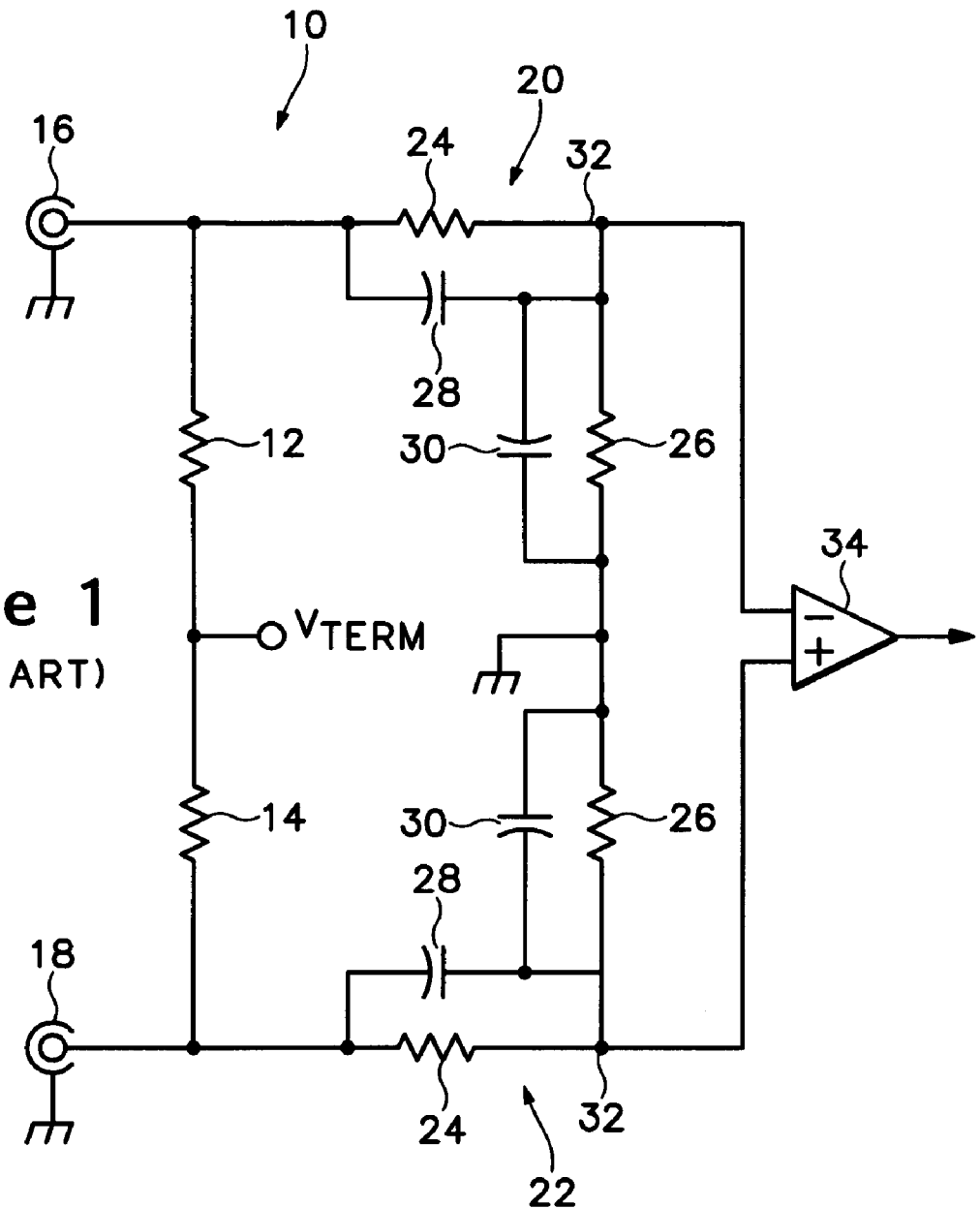
FIG. 1 is a schematic representation of a prior art input differential termination and attenuator network.
Figure 2:
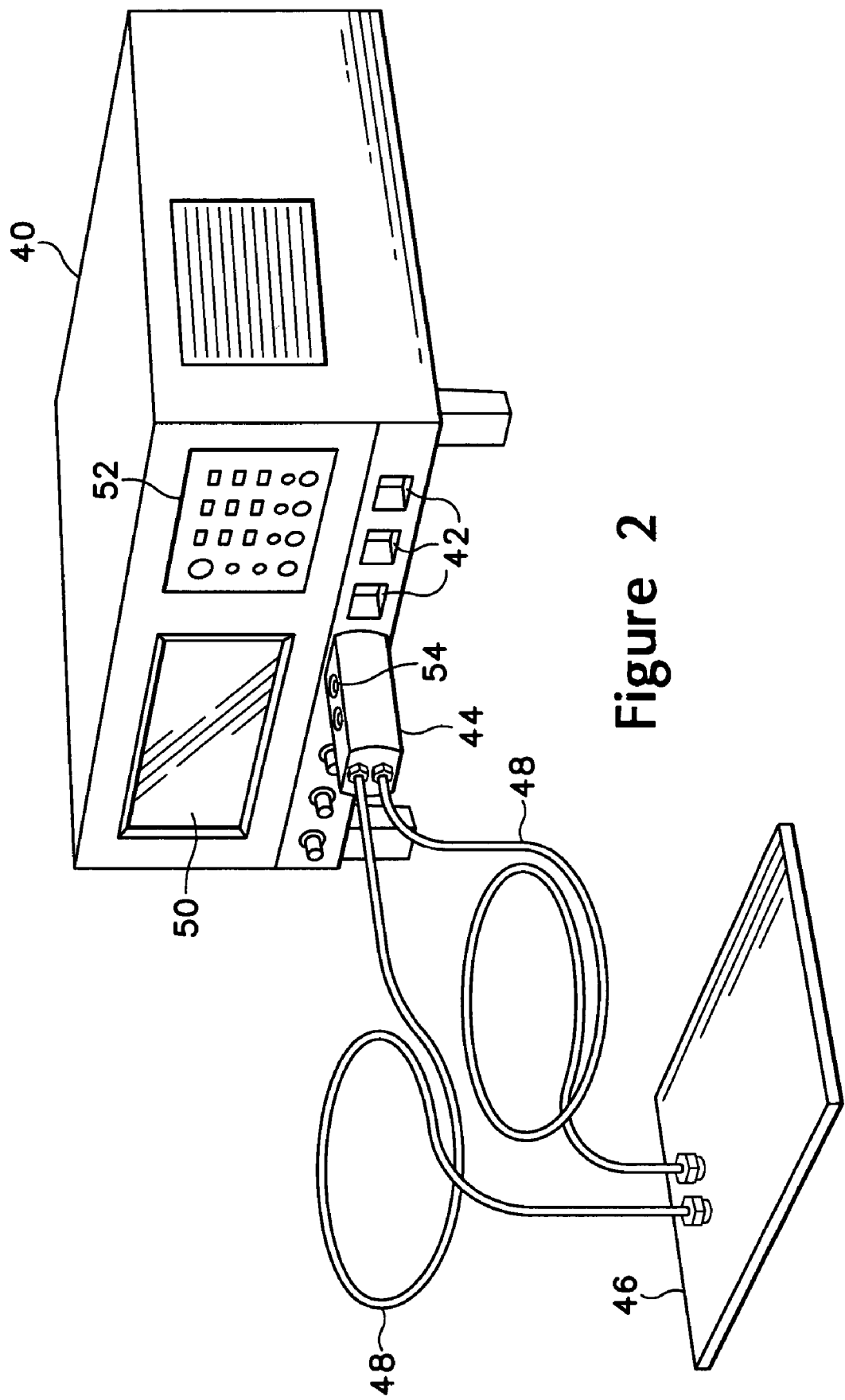
FIG. 2 is a perspective view of a measurement instrument having a measurement probe incorporating the input differential termination and attenuator network according to the present invention.

Referring to FIG. 2, there is shown a measurement test instrument 40, such as a TDS6804B oscilloscope manufactured and sold by Tektronix, Inc. The oscilloscope 40 has multiple accessory interfaces 42 for connecting one or more accessory devices 44 to the oscilloscope, such as a differential measurement probe incorporating the input differential termination and attenuator network of the present invention. Each accessory interface 42 has a coaxial signal input line and voltage power, clock, data, sensing and memory power lines as described in U.S. Pat. No. 6,629,048 B1, titled "Measurement Test Instrument and Associated Voltage Management System for Accessory Device" and incorporated by reference in its entirety. The accessory interface 42 provides voltage power from the oscilloscope 40 to the measurement probe 44 and bidirectional communications between the oscilloscope 40 and the probe 44. The differential measurement probe 44 is coupled to a device under test 46 via SMA terminated coaxial cables 48. The oscilloscope 40 has a display device 50 on which is displayed a graphical user interface and processed signals from a device under test 46. Generally, the measurement test instrument 40 includes front panel controls 52, such as rotatable knobs, push buttons and the like for controlling the settings of the instrument. Alternatively, the front panel controls may be graphically generated and displayed on the display device 50 and controllable by the user. The differential measurement probe 44 has input connectors 54 for receiving an external termination voltage $V_{TERM}$.

Figure 3:
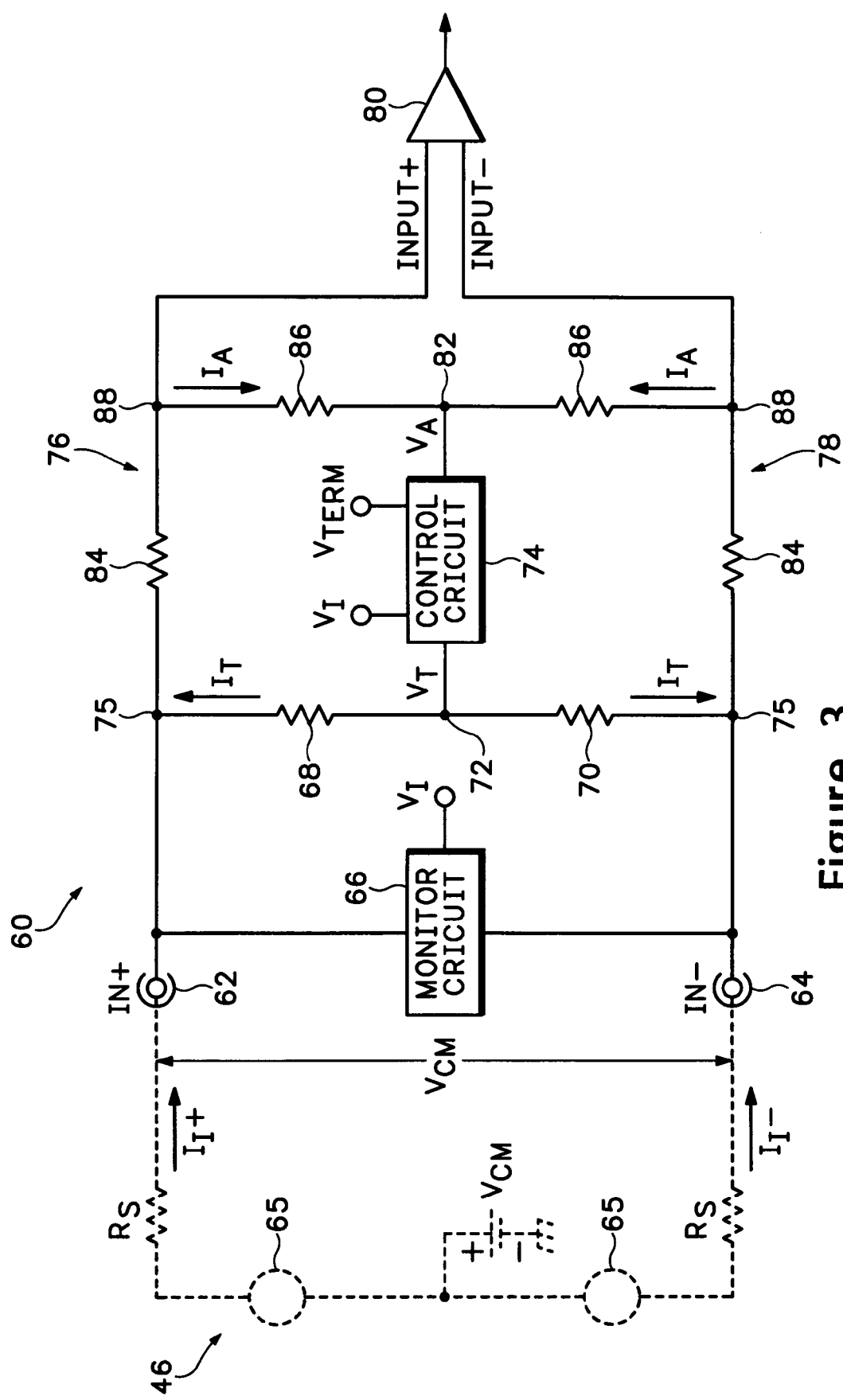
FIG. 3 is a representative block diagram of the input differential termination and attenuator network according to the present invention.

Referring to FIG. 3, there is shown a schematic block diagram of the input differential termination and attenuation network 60 of the present invention incorporated into the differential measurement probe 44. The input differential termination and attenuation network 60 receives differential input signals, IN+, IN−, from the device under test 46 at inputs 62 and 64. The device under test 46 may be modeled as a DC common mode signal source, $V_{CM}$, a pair of complementary differential mode sources 65, and a differential source impedance represented by resistor $R_s$. The input signals are coupled to a monitoring circuit 66 and input termination resistors 68 and 70. The monitoring circuit 66 detects the input DC common mode voltage $V_{CM}$ of the signal source and generates an output signal $V_I$ representative of the combination of the input DC common mode voltage $V_{CM}$ and a voltage representative of an applied termination voltage $V_{TERM}$. The input termination resistors 68 and 70 have a common node 72 that receives a scaled termination voltage $V_T$ and drive current $I_T$ from a control circuit 74. Each input termination resistor 68 and 70 is electrically coupled to one of the input nodes 75 of attenuators 76, 78 with each of the attenuators 76 and 78 being coupled in parallel with one of the input termination resistors 68 and 70. Each attenuator has series coupled attenuation resistors 84 and 86 and an output node 88 between the resistors 84 and 86 that is coupled to one of the inverting and non-inverting inputs of the differential amplifier 80. The attenuators 76 and 78 have a common node 82 that receives a scaled compensation voltage $V_A$ and drive current $I_A$ from the control circuit 74. The control circuit 74 receives the output signal $V_I$ from the monitor circuit 66 and an externally applied termination voltage $V_{TERM}$. The control circuit 74 generates the scaled termination voltage $V_T$ and drive current $I_T$ and scaled compensation voltage $V_A$ and drive current $I_A$ that are a function of the externally applied termination voltage $V_{TERM}$ and the input DC common mode voltage $V_{CM}$.

The input differential termination and attenuation network 60 of the present invention operates to null the DC currents at the inputs 62 and 64 when the input DC common mode voltage $V_{CM}$ equals the termination voltage $V_{TERM}$ and the input source resistances are matched. Further, the present invention sets the DC common mode voltage at the output nodes 88 of the attenuators 76, 78 to optimize the dynamic range of the amplifier 80 for differing levels of the DC common mode voltage $V_{CM}$ and the applied termination voltage $V_{TERM}$. The scaled termination voltage $V_T$ and drive current $I_T$ in conjunction with the scaled compensation voltage $V_A$ and drive current $I_A$ generate DC currents through the input termination resistors 68 and 70 and the attenuators 76 and 78 to produce a voltage equivalent to the externally applied termination voltage $V_{TERM}$ at the effective termination resistance connected to input 62 and 64. The DC currents further produce a DC common mode voltage at the output nodes 88 of the attenuators 76 and 78 that optimizes the dynamic range of the differential amplifier 80. In the preferred embodiment of the invention, the DC common mode voltage at the outputs nodes 88 of the attenuators 76 and 78 is set to a substantially fixed zero volts which provides the optimum dynamic range for the differential amplifier 80. The generalized equations for the control circuit 74 to set the voltage representative of the termination voltage $V_{TERM}$ and set the DC common mode voltage at the output nodes 88 of the attenuators 76 and 78 for optimizing the differential amplifier dynamic range are as follows. The equation for the scaled termination voltage $V_T$ is:

$$V_T = A \times V_{TERM} + B \times (V_I - V_{TERM})$$

and the equation for the scaled compensation voltage $V_A$ is:

$$V_A = -C \times V_{TERM} - D \times (V_I - V_{TERM})$$

where A, B C and D are scalars that are a function of the resistive values of the input termination resistors 68, 70 and the attenuation resistors 84, 86. The equations are valid for the specific conditions of matched source impedance inputs and differential mode AC signals with a common mode DC component. Where the input DC common mode input voltage $V_{CM}$ and the applied termination voltage $V_{TERM}$ are equal, the $V_T$ and $V_A$ voltages are proportional to the applied termination voltage $V_{TERM}$ as represented by the equation terms $A \times V_{TERM}$ and $-C \times V_{TERM}$. Voltage difference variations between the input DC common mode input voltage $V_{CM}$ and the applied termination voltage $V_{TERM}$, may be corrected by adding correction factors to the $V_T$ and $V_A$ equations. The corrections factors are derived from the detection of the combination of the input DC common mode input voltage $V_{CM}$ and the voltage representative of the termination voltage $V_{TERM}$ using the monitoring circuit 66 and applying the output signal $V_I$ to the control circuit 74 to generate the equation correction terms $B \times (V_I - V_{TERM})$ and $-D \times (V_I - V_{TERM})$. The input differential termination and attenuation network 60 corrects for differences between the input DC common mode voltage $V_{CM}$ and the applied termination voltage $V_{TERM}$ by generating the scaled termination voltage $V_T$ and drive current $I_T$ and the scaled compensation voltage $V_A$ and drive current $I_A$ that drive the output nodes 88 of the attenuators 76 and 78 to a substantially fixed zero volt level for the optimum dynamic range of the differential amplifier 80.

In the preferred embodiment of the invention, the input differential termination and attenuation network 60 is optimally designed to receive the differential signal from an input source having a differential 50 ohm impedance and a DC common mode voltage $V_{CM}$. The input termination resistors 68, 70 have nominal resistive values of 66.7 ohms. The input termination resistors 68, 70 are in parallel with attenuation resistors 84, 86 having respective nominal resistive values of 120 and 80 ohms. The effective input resistance resulting from the input termination resistors 68, 70 in parallel with the attenuation resistors 84, 86 is 50 ohms to a common mode termination voltage $V_{TERM}$ for each side of the differential network. The attenuation factor for each of the attenuators 76, 78 is 2.5×. The effective input resistance and attenuation factor are but one implementation of the present invention and other effective input termination resistances and attenuation factors may be used without departing from the scope of the present invention.

The derivations of the scaled termination voltage $V_T$ and scaled compensation voltage $V_A$ are described below for matched 50 ohm source impedance inputs and differential mode AC signals with a common mode DC component. The desired DC voltages at the inputs 62 and 64 are represented by the equation:

$$IN+ = IN- = \frac{(V_{CM} + V_{TERM})}{2}$$

where IN+ and IN− are the common mode DC voltage components on the inputs 62 and 64, $V_{CM}$ is the common mode voltage applied through the 50 ohm source impedance to the inputs 62 and 64, and $V_{TERM}$ is the termination voltage applied at the common mode node between the effective 50 ohm input resistances. The desired common mode DC voltages on the inverting and non-inverting inputs of the differential amplifier 80 should be 0 volts DC to achieve the maximum dynamic range for the amplifier as represented by the equation:

$$\text{INPUT+} = \text{INPUT-} = 0$$

The $V_T$ and $V_A$ voltages from the control circuit 74 are dependent on the $V_{CM}$ common mode voltage at the inputs 62 and 64 and can be solved to satisfy the above equations. For the case where $V_{CM} = V_{TERM}$, the voltages $V_T$ and $V_A$ are both proportional to $V_{TERM}$:

$$V_T = 1.5556 \times V_{TERM}$$

$$V_A = -0.6667 \times V_{TERM}$$

where 1.5556 and 0.6667 are proportional scalars that are a function of the values of the input termination resistors 68, 70 and the attenuation resistors 84, 86.

If the $V_T$ and $V_A$ voltages are scaled versions of $V_{TERM}$, then variations between the input DC common mode voltage signal $V_{CM}$ and the termination voltage $V_{TERM}$ at the inputs 62 and 64 represent the average voltage between input DC common mode voltage signal $V_{CM}$ and $V_{TERM}$ when the input source resistances match the termination resistance. However, the voltage inputs, INPUT+ and INPUT−, to the inverting and non-inverting nodes of the differential amplifier 80 are not held at zero volts as the input DC common mode voltage signal $V_{CM}$ varies, but ranges over an attenuated percentage of the $V_{CM}$ value as represented by the following equation:

INPUT+=INPUT−=0.2×($V_{CM}$−$V_{TERM}$)

The monitoring circuit 66 detects the combination of the input DC common mode voltage $V_{CM}$ and the voltage representative of the termination voltage $V_{TERM}$ and generates an output signal $V_I$ that is coupled to the control circuit 74 for adjusting the $V_T$ and $V_A$ voltages. For the case where the input signal is supplied by a 50 ohm source, the following relationship exists between the sensed voltage $V_I$ and the input common mode voltage $V_{CM}$:

$$V_I = \frac{V_{CM} + V_{TERM}}{2} => V_{CM} = 2 \times V_I - V_{TERM}$$

It is possible for the 2.5× attenuator to compensate for the $V_{CM}$ input by adding correction factors to the $V_T$ and $V_A$ voltages of the form:

$\Delta V_T$=0.1111×($V_{CM}$−$V_{TERM}$)

$\Delta V_A$=−0.3333×($V_{CM}$−$V_{TERM}$)

where 0.1111 and 0.3333 are proportional scalars that are a function of the values of the input termination resistors 68, 70 and the attenuation resistors 84, 86. Using the above equation for the relationship between $V_{CM}$ and $V_I$, it can be seen that:

($V_{CM}$−$V_{TERM}$)=2×($V_I$−$V_{TERM}$)

Substituting the above expression into the correction factor terms $\Delta V_T$ and $\Delta V_A$, the scaled termination voltage $V_T$ and the scaled compensation voltage $V_A$ become:

$V_T$=1.5556×$V_{TERM}$+0.2222×($V_I$−$V_{TERM}$)

$V_A$=−0.6667×$V_{TERM}$−0.6667×($V_I$−$V_{TERM}$)

Figure 4:
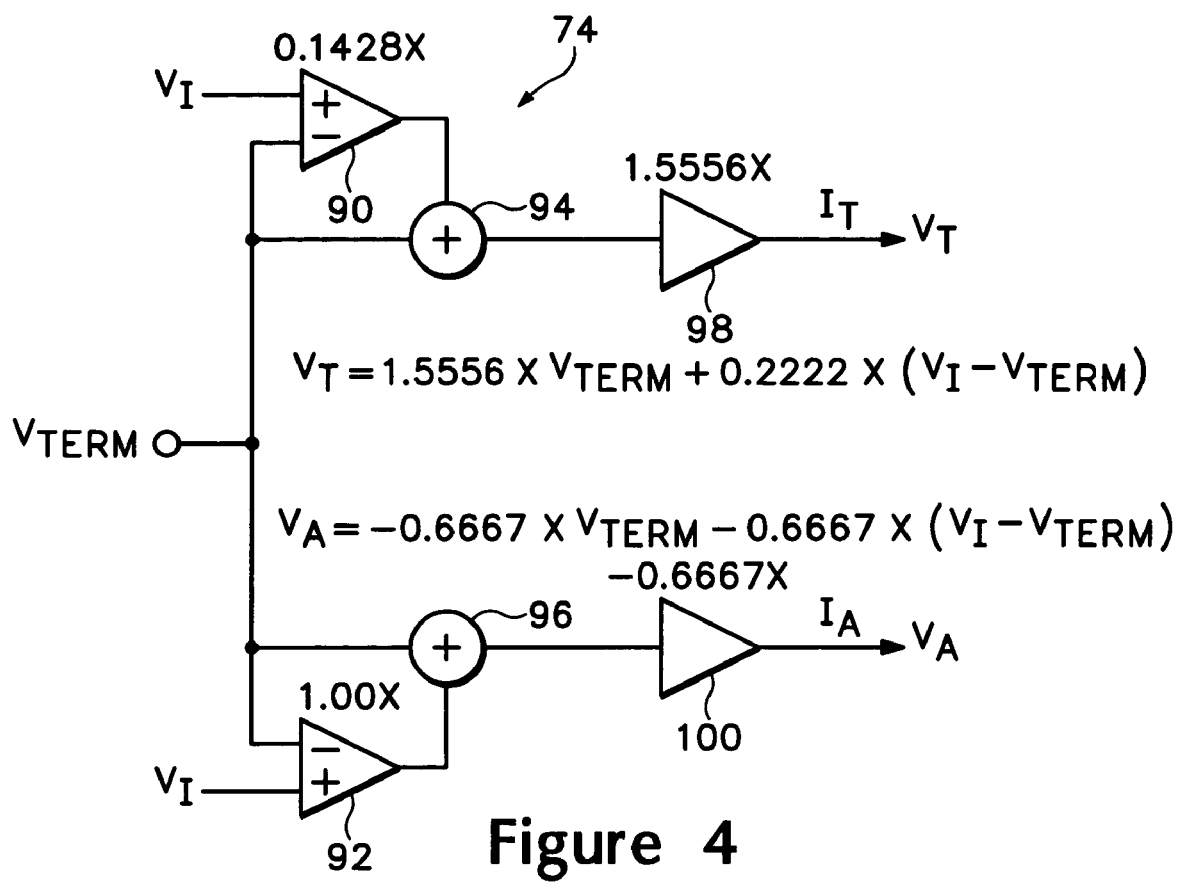
FIG. 4 is a functional schematic diagram of the control circuit of the input differential termination and attenuator network according to the present invention.

Referring to FIG. 4, there is shown a functional schematic diagram of the control circuit 74 of the input differential termination and attenuator network 60. The external termination voltage $V_{TERM}$ is coupled to minus inputs nodes of differential gain amplifiers 90 and 92 as well as summing nodes 94 and 96. The output signal $V_I$ from the monitoring circuit 66 representing the combination of the input DC common mode voltage $V_{CM}$ and the termination voltage $V_{TERM}$ is coupled to the plus input nodes of the differential gain amplifiers 90 and 92. Differential gain amplifier 90 has a gain of 0.1428× and differential gain amplifier 92 has a gain of 1.00×. The output of differential gain amplifier 90 is 0.1428×($V_I$−$V_{TERM}$) which is applied to the summing node 94. The output of the summing node 94 is $V_{TERM}$+0.1428× ($V_I$−$V_{TERM}$). The output of the summing node 94 is coupled to the input of driver amplifier 98 having a gain of 1.5556×. The output of the driver amplifier 98 is the scaled termination voltage $V_T$ having an output equal to $V_T$=1.5556× $V_{TERM}$+0.2222×($V_I$−$V_{TERM}$) and the scaled termination voltage drive current $I_T$. The output of differential gain amplifier 92 is 1.00×($V_I$−$V_{TERM}$) which is applied to the summing mode 96. The output of the summing node 96 is $V_{TERM}$+($V_I$−$V_{TERM}$). The output of the summing node 96 is coupled to the input of drive amplifier 100 having a gain of −0.6667×. The output of the drive amplifier 100 is the scaled compensation voltage $V_A$ having an output equal to $V_A$= −0.6667×$V_{TERM}$−0.6667×($V_I$−$V_{TERM}$) and the scaled compensation voltage drive current $I_A$.

Figure 5:
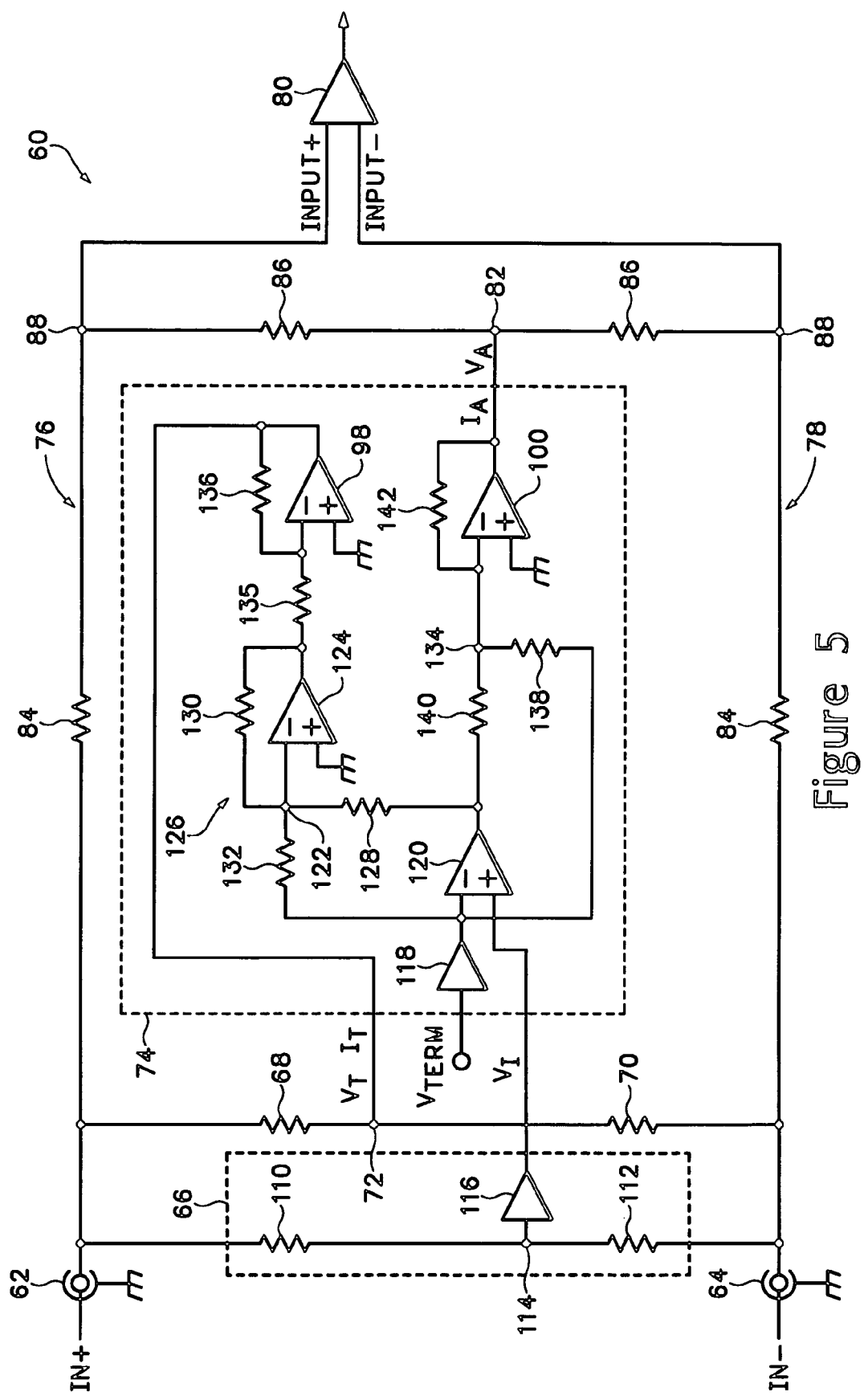
FIG. 5 is schematic representation of the preferred embodiment of the input differential termination and attenuator network according to the present invention.

Referring to FIG. 5, there is shown a schematic representation of the preferred embodiment of the input differential termination and attenuator network 60. Like elements from previous drawing figures are labeled the same. The differential input signals, IN+, IN−, are coupled via the inputs 62 and 64 to the monitoring circuit 66 and the junction of the input termination resistors 68 and 70 with their respective attenuator 76 and 78. The differential input signals, IN+, IN−, are terminated by the effective termination resistances of the input termination resistors 68 and 70 in parallel with the attenuation resistors 84 and 86. The output nodes 88 between the attenuation resistors 84 and 86 are coupled to the inverting and non-inverting inputs of the differential amplifier 80. The monitoring circuit 66 has resistive elements 110 and 112 that present a high impedance to the input DC common mode voltage $V_{CM}$ relative to the effective input termination resistances. In the preferred embodiment the resistive elements 110 and 112 have resistive values of approximately 5000 ohms. The resistive elements 110 and 112 form a voltage divider network between the inputs 62 and 64. The common node 114 of the voltage divider network provides the output voltage $V_I$ that is coupled through a buffer amplifier 116 to the control circuit 74.

The control circuit 74 also received an external termination voltage $V_{TERM}$. The external termination voltage $V_{TERM}$ is coupled through a buffer amplifier 118 to the minus input of a 1× differential gain correction amplifier 120. The plus input of the differential correction amplifier 120 receives the $V_I$ output signal of the monitoring circuit 66. The differential correction amplifier 120 generates an output voltage equal to ($V_I$−$V_{TERM}$). The ($V_I$−$V_{TERM}$) output voltage is coupled to the input summing node 122 of summing amplifier 124 through an active attenuation circuit 126 consisting of attenuation resistors 128 and 130. The buffered external termination voltage $V_{TERM}$ is also coupled to the summing node 122 via resistor 132. The summing amplifier 124 generates an output voltage equal to $V_{TERM}$+0.1428×($V_I$− $V_{TERM}$) where the scalar term 0.1428 is a function of the attenuation factor of the attenuation circuit 126 The voltage output of the summing amplifier 124 is coupled to the input of the $V_T$ drive amplifier 98. The voltage gain for the $V_T$ drive amplifier 98 is set by the resistors 135 and 136 that provides a 1.5556 scaling factor for generating a voltage output of $V_T$=1.5556×$V_{TERM}$+0.2222×($V_I$−$V_{TERM}$) and a drive current $I_T$ which is coupled to the common node 72 of the input termination resistors 68 and 70.

The external termination voltage $V_{TERM}$ is further coupled to summing node 134 via resistor 138. The output of the differential gain correction amplifier 120 is also coupled to the summing node 134 via resistor 140 where resistors 138 and 140 have substantially the same resistive values. The input voltage to the summing node 134 has a value of $V_{TERM}$+($V_I$−$V_{TERM}$) that is coupled to the input of the $V_A$ drive amplifier 100. A gain resistor 142 coupled across the $V_A$ driver amplifier 100 together with the summing node resistors 138 and 140 provides a −0.667 scaling factor for generating an output voltage of $V_A$=−0.6667×$V_{TERM}$−

0.6667×$(V_I-V_{TERM})$ and a drive current $I_A$ which is coupled to the common node 82 of the attenuators 76 and 78.

The above description was based on a matched 50 ohm source impedance. The DC common mode compensation described in this invention is also valid for other balanced input source impedance values. The below equations describe the compensation network topology voltages for three common source impedance cases. The AC-coupled source impedance case is effectively describing the result of an infinite DC source resistance. The below equations are shown in relation to the DC common mode voltage $V_{CM}$ instead of the term $(V_I-V_{TERM})$.

Zero Ohm Source Impedance $V_T = 1.3333 \times V_{TERM} + 0.2222 \times V_{CM}$ $V_A = -0.6667 \times V_{CM}$ $V_I = V_{CM}$ 50 Ohm Source Impedance $V_T = 1.4444 \times V_{TERM} + 0.1111 \times V_{CM}$ $V_A = -0.3333 \times V_{TERM} - 0.3333 \times V_{CM}$ $V_I = 0.5 (V_{TERM} + V_{CM})$ AC-Coupled Source Impedance $V_T = 1.5556 \times V_{TERM}$ $V_A = -0.6667 \times V_{TERM}$ $V_I = V_{TERM}$ The input differential termination and attenuation network 60 of the present invention has a response down to DC that allows for differential mode DC signals to be processed. In the case of an unbalanced, differential mode DC signal input $V_{DM}$ applied to the IN+ signal input 62 and zero volts applied to the IN− signal input 64, the input differential termination and attenuation network 60 still attempts to balance the common mode DC voltage at the output nodes 88 of the attenuators 76 and 78. In the case of the differential mode DC signal just described, from a zero ohm source impedance, the resulting differential amplifier 80 input DC voltages are:

INPUT+ = +0.2×$V_{DM}$

INPUT− = −0.2×$V_{DM}$

The above equations show that the differential mode DC input has the correct 2.5× attenuation and has been level shifted to give a zero common mode signal at the inputs of the differential amplifier 80. Even for differential mode DC inputs, the input differential termination and attenuation network 60 attempts to maximize the dynamic range of the differential amplifier 80.

The above invention has been described in relation to a differential termination and attenuation network 60 having an effective 50 ohm termination and an attenuation factor of 2.5×. These particular parameters result in scalars A, B, C, and D of $V_T$ and $V_A$ being a specified value. The present invention may also be implemented for different effective differential termination values and different attenuation factors which would result in different scaling factors for $V_T$ and $V_A$. Further, the present invention is optimized for maximizing the dynamic range of the output differential amplifier 80. To achieve this parameter, the scaled compensation voltage $V_A$ is set to provide a substantially fixed zero volt DC common mode voltage to the inverting and non-inverting input of the differential amplifier 80.

A differential termination and attenuator network has been described having first and second input termination resistors coupled in parallel with corresponding resistive attenuator circuits. A monitoring circuit is coupled to input nodes of the network and generates an output signal representative of the combination of a DC common mode voltage on the input nodes and a termination voltage. A control circuit receives the output signal from the monitoring circuit and the termination voltage and generates a scaled termination voltage and a scaled compensation voltage and associated drive currents. The scaled termination and compensation voltages and drive currents provide DC currents through the input termination resistances and the attenuators for nulling DC currents at the network input nodes and provides a DC common mode voltage output from the first and second attenuators for optimizing the dynamic range of a differential measurement amplifier.

It will be obvious to those having skill in the art that many changes may be made to the details of the above-described embodiments of this invention without departing from the underlying principles thereof. The scope of the present invention should, therefore, be determined only by the following claims.

What is claimed is:

1. A differential termination and attenuator network receiving a DC common mode voltage from a voltage source having source resistances and coupled to a differential amplifier comprising:
   first and second input termination resistances having a common node and respective input nodes receiving the DC common mode voltage from the voltage source;
   first and second attenuators having a common node and respective input nodes and output nodes with each respective input node coupled to one of the first and second input termination resistances;
   a monitoring circuit coupled to the input nodes of the first and second input termination resistances for generating an output signal representative of the combination of the DC common mode voltage on the input source resistances and a voltage representative of an applied termination voltage on the input termination resistances; and
   a control circuit receiving the applied termination voltage and the monitoring circuit output signal and generating a scaled termination voltage and drive current and a scaled compensation voltage and drive current that are a function of the applied termination voltage and the DC common mode voltage with the scaled termination voltage and drive current coupled to the common node of the first and second input termination resistances and the scaled compensation voltage and drive current coupled to the common node of the first and second attenuators for providing DC currents through the first input termination resistance and first attenuator and the second input termination resistance and second attenuator for nulling DC currents at the input nodes of the first and second input termination resistances and providing a DC common mode voltage at the output nodes of the first and second attenuators for optimizing the dynamic range of the differential amplifier.

2. The differential termination and attenuator network as recited in claim 1 wherein the monitoring circuit comprises a resistive voltage divider network having high impedance inputs relative to the first and second input termination resistances.

3. The differential termination and attenuator network as recited in claim 1 wherein the first and second input termination resistances further comprise respective first and second input termination resistors with the first input termination resistor coupled in parallel with the first attenuator and the second input termination resistor coupled in parallel with the second attenuator.

4. The differential termination and attenuator network as recited in claim 3 wherein each of the first and second attenuators comprise first and second resistors with one side of the first resistor coupled to one of the first and second input termination resistors and the other side coupled to one side of the second resistor at the output node of the attenuator and the other side of the second resistor coupled to receive the scaled compensation voltage and drive current at the common node of the first and second attenuators.

5. The differential termination and attenuator network as recited in claim 4 wherein the scaled termination and scaled compensation voltages have scaling factors that are a function of the first and second input termination resistors and the first and second resistors of the respective first and second attenuators.

6. The differential termination and attenuator network as recited in claim 5 wherein the scaled termination voltage has a first scaling factor providing a first voltage proportional to the applied termination voltage and a second scaling factor providing a correction voltage proportional to the difference between the DC common mode voltage on the input nodes of the first and second input termination resistances and the applied termination voltage.

7. The differential termination and attenuator network as recited in claim 5 wherein the scaled compensation voltage has a first scaling factor providing a first voltage proportional to the applied termination voltage and a second scaling factor providing a correction voltage proportional to the difference between the DC common mode voltage on the input nodes of the first and second input termination resistances and the applied termination voltage.

8. The differential termination and attenuator network as recited in claim 1 wherein the control circuit further comprises:

a differential amplifier receiving the output signal from the monitoring circuit and the applied termination voltage and generating an output signal representative of the difference between the output signal from the monitoring circuit and the applied termination voltage;

a first summing node coupled to receive the applied termination voltage and the output signal from the differential amplifier and generating an output signal representative of the applied termination voltage and an attenuated representation of the output signal from the differential amplifier;

a second summing node coupled to receive the applied termination voltage and the output signal from the differential amplifier and generating an output signal representative of the applied termination voltage and the output signal from the differential amplifier;

a first drive amplifier having a scaling gain factor and coupled to receive the output signal from the first summing node for generating the scaled termination voltage and drive current; and a second drive amplifier having a scaling gain factor and coupled to receive the output signal from the second summing node for generating the scaled compensation voltage and drive current.

9. The differential termination and attenuator network as recited in claim 8 wherein the first summing node comprises an active attenuation circuit receiving the output signal from the differential amplifier and a summing amplifier having an input node coupled to receive the applied termination voltage and coupled to an intermediate node of the attenuation circuit for receiving the attenuated representation of the output signal from the differential amplifier and generating the output signal representative of the applied termination voltage and the attenuated representation of the output signal from the differential amplifier.

10. The differential termination and attenuator network as recited in claim 1 wherein the scaled termination voltage and drive current and the scaled compensation voltage and drive current produce a substantially zero volts DC common mode voltage from the first and second attenuators.

* * * * *